US009257592B2

(12) United States Patent
Lu et al.

(10) Patent No.: US 9,257,592 B2
(45) Date of Patent: *Feb. 9, 2016

(54) TRANSLUCENT SOLAR CELL AND MANUFACTURING METHOD THEREOF

(75) Inventors: Chun-Hsiung Lu, Houli Township, Taichung County (TW); Chien-Chung Bi, Houli Township, Taichung County (TW)

(73) Assignee: Nexpower Technology Corp., Taichung (TW)

( * ) Notice: Subject to any disclaimer, the term of this patent is extended or adjusted under 35 U.S.C. 154(b) by 1470 days.

This patent is subject to a terminal disclaimer.

(21) Appl. No.: 12/043,807

(22) Filed: Mar. 6, 2008

(65) Prior Publication Data
US 2009/0151783 A1    Jun. 18, 2009

(30) Foreign Application Priority Data

Dec. 13, 2007 (TW) ............................... 96147620 A

(51) Int. Cl.
| | |
|---|---|
| H01L 25/00 | (2006.01) |
| H01L 31/042 | (2014.01) |
| H01L 31/00 | (2006.01) |
| H01L 31/18 | (2006.01) |
| H01L 31/0468 | (2014.01) |

(52) U.S. Cl.
CPC .......... H01L 31/186 (2013.01); H01L 31/0468 (2014.12); Y02E 10/50 (2013.01)

(58) Field of Classification Search
USPC .......................... 136/243, 244, 252, 258, 261
See application file for complete search history.

(56) References Cited

U.S. PATENT DOCUMENTS

| | | | | |
|---|---|---|---|---|
| 4,112,457 | A | * | 9/1978 | D'Aiello ........................ 136/255 |
| 4,681,928 | A | * | 7/1987 | Berger et al. ................. 528/353 |
| 4,686,321 | A | * | 8/1987 | Kishi ............................. 136/244 |
| 4,795,500 | A | | 1/1989 | Kishi et al. |
| 5,131,954 | A | * | 7/1992 | Vogeli et al. .................. 136/244 |
| 5,176,758 | A | * | 1/1993 | Nath et al. .................... 136/251 |
| 6,455,347 | B1 | * | 9/2002 | Hiraishi et al. ................. 438/80 |
| 6,858,461 | B2 | | 2/2005 | Oswald et al. |
| 2005/0284517 | A1 | * | 12/2005 | Shinohara ..................... 136/256 |
| 2006/0023991 | A1 | * | 2/2006 | Okubora ......................... 385/14 |
| 2006/0112987 | A1 | | 6/2006 | Nakata et al. |

OTHER PUBLICATIONS

Free Online Dictionary—pp. 1-2, obtained online from http://www.thefreedictionary.com/abut.*

* cited by examiner

*Primary Examiner* — Alexander Kollias
(74) *Attorney, Agent, or Firm* — Che-Yang Chen; Law Office of Michael Chen

(57) ABSTRACT

The present invention provides a translucent solar cell and a manufacturing method thereof. The translucent solar cell comprises, in stacking order, a substrate, a first electrode layer, a photoconductive layer and a second electrode layer. The translucent solar cell is characterized in that there are formed a plurality of first light-transmissive apertures on the second electrode layer and the plurality of first light-transmissive apertures are further extended in a depth direction to the photoconductive layer to form a plurality of second light-transmissive apertures corresponding to the first light-transmissive apertures. A projected area of each of the second light-transmissive apertures is equal to or smaller than that of a corresponding first light-transmissive aperture.

14 Claims, 3 Drawing Sheets

TRANSLUCENT SOLAR CELL AND MANUFACTURING METHOD THEREOF

BACKGROUND OF THE INVENTION

1. Field of the Invention

The present invention relates to a translucent solar cell and a manufacturing method thereof, and more particularly, to a translucent solar cell which has improved light transmissibility and can avoid short-circuit during a manufacturing process thereof.

2. Description of Related Art

Thin-film solar cells include various thin films deposited on a substrate. These thin films are partitioned by laser-cutting into a number of individual and series-connected unit cells. The thin films deposited on the substrate sequentially includes, in a bottom-up direction, a front electrode layer, a photoconductive layer and a back electrode layer. The front electrode layer can be made of $SnO_2$, ITO, ZnO, AZO, GZO, IZO, etc. The photoconductive layer can be made of IV group semiconductors or III-V, II-VI or I-III-VI group compounds. The back electrode layer can be made of Ag, Al, or Cr.

In general, the front electrode layer may be formed by sputtering or chemical vapor deposition (e.g. APCVD or LPCVD). The photoconductive layer may be formed by plasma-enhanced chemical vapor deposition (PECVD). The back electrode may be formed by sputtering or physical vapor deposition (PVD). In the prior art of translucent solar cell, U.S. Pat. No. 4,795,500 discloses a solar cell, as shown in FIG. 1A. The solar cell includes a substrate 1, a photoelectric conversion element 2 (including a front electrode layer 3, a photoactive layer 4 and a back electrode layer 5), and a resist layer 8. In fabricating the solar cell, the resist layer 8 is used as a mask in an etching process to form a desired light-transmissive region 6.

Besides, U.S. Pat. No. 6,858,461 discloses another solar cell. Referring to FIG. 1B, the solar cell 110 includes a substrate 114, a front electrode layer 118, a photoactive layer 120 and a back electrode layer 122. A plurality of transparency scribes 140 are formed on the solar cell 110 by laser cutting in a direction perpendicular to the grooves 128 for partitioning the solar cell into separate and series-connected unit cells 112. Meanwhile, the metal back electrode layer 122 is removed to form a light-transmissive region, so that a light source 116 can transmit through the solar cell module 110, thereby producing a transparent effect. In addition, U.S. Patent Publication No. 2006/0112987 discloses another solar cell (not shown), which employs a laser to remove a back electrode layer or the back electrode layer and a photoconductive layer to create a plurality of holes, such that a plurality of light-transmissive regions are formed over the entire solar cell module to produce a transparent effect on the entire solar cell module.

In the prior art cited above, while forming the light-transmissive regions, no matter whether a laser or an etching process is used to remove the film material such that holes or scribe lines are formed on the film layer, incomplete removal of film material from the holes or scribe lines can easily occur when the film layer is being cut due to a thermal effect, thus causing bridging of the conductive layers and hence a short-circuit therebetween. In addition, if the region to be removed is a hole, and given that the hole size is rather small, a large number of holes must be formed to produce a translucent solar cell module which allows light to transmit therethrough. As a result, each time the film material is removed during the process, the risk of having a short-circuit increases. And the occurrence of short-circuit can be reduced only by reducing the number of times of film material removal. Furthermore, if a laser is used, variation of the shape and size of the resulting hole is limited due to the limitation of laser beam itself. If holes of different shapes or of a larger size are desired, a laser with higher specification or higher power is required, thus increasing the manufacturing cost.

SUMMARY OF THE INVENTION

To overcome the shortcomings in the prior art, the present invention provides a translucent solar cell and a manufacturing method thereof. The translucent solar cell comprises, in order of stacking, a substrate, a first electrode layer (also referred to as "front electrode layer"), a photoconductive layer (also referred to as "photoactive layer") and a second electrode layer (also referred to as "back electrode layer"). A plurality of first light-transmissive apertures are formed on the second electrode layer by removing material thereof, and the plurality of first light-transmissive apertures are further extended in a depth direction into the photoconductive layer to form a plurality of second light-transmissive apertures corresponding to the first light-transmissive apertures, wherein a projected area of each of the second light-transmissive apertures is smaller than that of a corresponding first light-transmissive aperture. Therefore, by removing different areas of material from different film layers, short-circuits can be avoided during the process of forming holes by material removal. In addition, the projected patterns of the light-transmissive apertures may take the shape of a strip, a rectangle, a polygon, a circle, an ellipse, an arc, or any other irregular shapes by using a laser together with a mask, thus making it possible to change the areas and shapes of the removed regions, thereby avoiding insufficient light transmissibility. Furthermore, a higher specification or higher power laser is not required, thus reducing the manufacturing cost.

Accordingly, it is a primary objective of the present invention to provide a translucent solar cell, wherein projected patterns of light-transmissive apertures can be arbitrarily changed to improve an overall light-transmissibility of the translucent solar cell.

A secondary objective of the present invention is to provide a translucent solar cell and a manufacturing method thereof, wherein different areas of material can be removed from different film layers during a manufacturing process so as to avoid short-circuit between film layers.

A further objective of the present invention is to provide a translucent solar cell, wherein light-transmissive apertures of arbitrary shapes can be formed by using a laser together with a mask to reduce manufacturing cost.

DETAILED DESCRIPTION OF THE PREFERRED EMBODIMENTS

The present invention relates to a translucent solar cell and a manufacturing method thereof. The principle used therein regarding the photoelectric conversion of solar cells has been known to those of ordinary skill in the art and is therefore not described in detail in the following description. Also, it is to be understood that the drawings referred to in the following description are merely structural schematic views showing features of the present invention and are not made according to their actual dimensions.

Figure 1A:
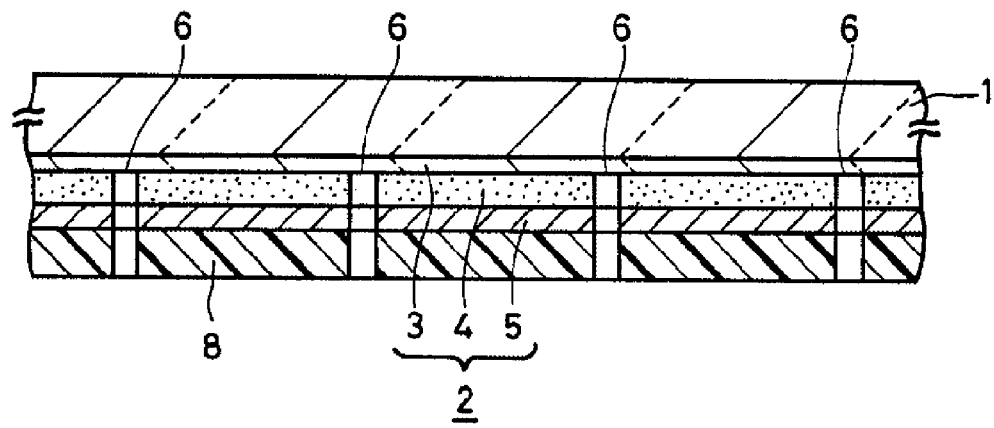
FIG. 1A is a schematic view illustrating a conventional translucent solar cell.
Figure 1B:
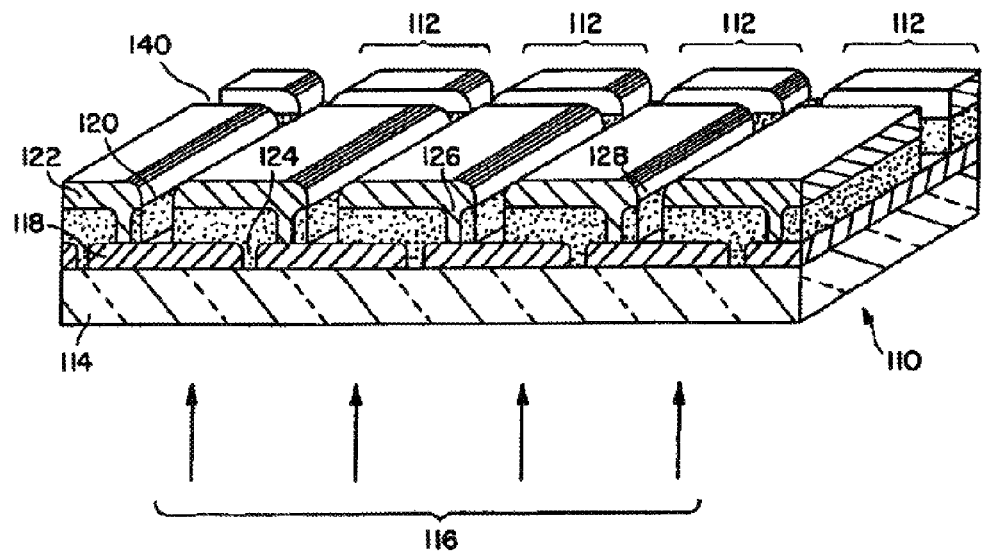
FIG. 1B is a schematic view illustrating another conventional translucent solar cell.
Figure 2A:
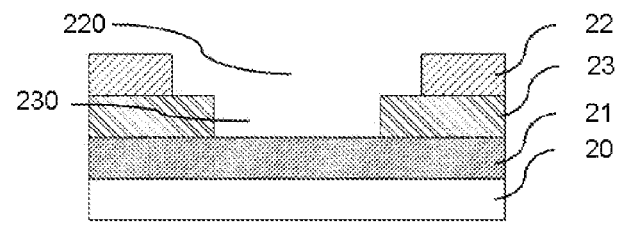
FIG. 2A is a schematic view illustrating a translucent solar cell in accordance with a first preferred embodiment of the present invention.

FIG. 2A illustrates a cross-sectional view of a translucent solar cell in accordance with a first preferred embodiment of the present invention. The translucent solar cell 2 includes, in order of stacking, a substrate 20, a first electrode layer 21, a photoconductive layer 23 and a second electrode layer 22. The first electrode layer 21 is formed on the substrate 20 by a method selected from the group consisting of sputtering, atmospheric pressure chemical vapor deposition (APCVD), and low pressure chemical vapor deposition (LPCVD). The photoconductive layer 23 is formed on the first electrode layer 21 by deposition. The second electrode layer 22 is formed on the photoconductive layer 23 by sputtering or physical vapor deposition (PVD). In general, the substrate 20 is made of a transparent material. The first electrode layer 21 is a single-layer or multilayer transparent conductive oxide (TCO) selected from the group consisting of $SnO_2$, ITO, ZnO, AZO, GZO and IZO. The photoconductive layer 23 is a single-layer or multilayer structure of a material selected from the group consisting of crystalline silicon semiconductor, amorphous silicon semiconductor, semiconductor compound, organic semiconductor and photo sensitized dye. The second electrode layer 22 is a single-layer or multilayer structure including mainly a metal layer of a material selected from the group consisting of Ag, Al, Cr, Ti, Ni and Au. In addition, the second electrode layer 22 may also include a TCO selected from the group consisting of $SnO_2$, ITO, ZnO, AZO, GZO, IZO, and the like.

Figure 2B:
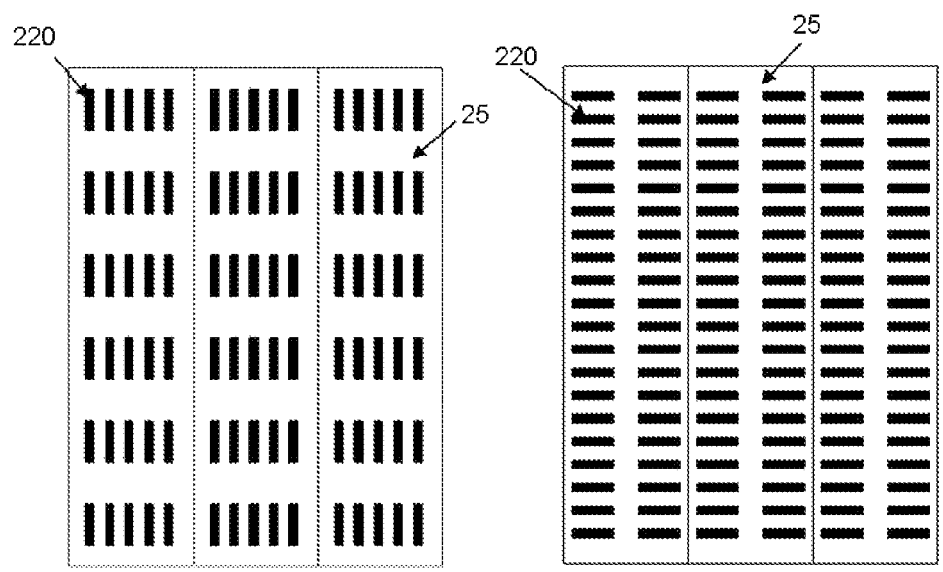
FIG. 2B is another schematic view illustrating the translucent solar cell in accordance with the first preferred embodiment of the present invention.

In the above embodiment, in order to produce a transparent effect on the solar cell 2 by layer removal, a mask (not shown) having a plurality of groups of predetermined perforated patterns with a specific shape thereon is disposed on unit cells 25 of the solar cell 2. Then a laser beam is emitted through the perforated patterns of the mask onto the second electrode layer 22 of each unit cell 25, as shown in FIG. 2B, thereby forming a plurality of first light-transmissive apertures 220 on the second electrode layer 22. These first light-transmissive apertures 220 are arranged in an array and have predetermined projected patterns. Then the laser beam is further directed in a depth direction through the first light-transmissive aperture 220 onto the photoconductive layer 23, thereby forming a plurality of second light-transmissive apertures 230 corresponding to the first light-transmissive apertures 220. The projected area of each of the second light-transmissive apertures 230 is smaller than that of a corresponding first light-transmissive aperture 220, thereby avoiding short-circuit between film layers.

In the above embodiment, the first light-transmissive apertures 220 and the second light-transmissive apertures 230 may have cross-sectional projected patterns in the shape of a strip, a rectangle, a polygon, a circle, an ellipse, an arc, or an irregular shape. The cross-sectional projected patterns of these light-transmissive apertures can be changed according to practical needs, thereby making it possible to change the areas and shapes of the removed regions to improve light transmissibility. On the other hand, now that all one has to do is to change the patterns on the mask and a higher specification or higher power laser is not required, so that the manufacturing cost can be reduced.

Figure 3:
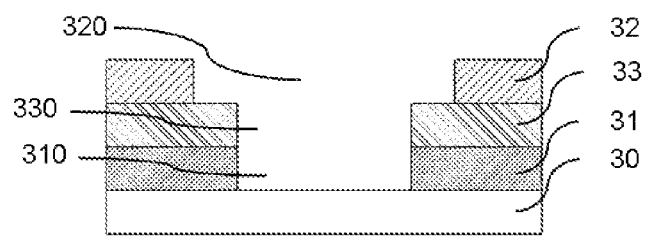
FIG. 3 is a schematic view illustrating a translucent solar cell in accordance with a second preferred embodiment of the present invention.

FIG. 3 illustrates a cross-sectional view of a translucent solar cell in accordance with a second preferred embodiment of the present invention. The translucent solar cell 3 includes, in order of stacking, a substrate 30, a first electrode layer 31, a photoconductive layer 33 and a second electrode layer 32. The second electrode layer 32 is formed with a plurality of first light-transmissive apertures 320, which are further extended in a depth direction to the photoconductive layer 33 to form a plurality of second light-transmissive apertures 330 corresponding to the first light-transmissive apertures 320. The projected area of each of the second light transmissive aperture 330 is smaller than that of a corresponding first light-transmissive aperture 320. It should be noted that, in this embodiment, the second light-transmissive apertures 330 are further extended in the depth direction to the first electrode layer 31 to form a plurality of third light-transmissive apertures 310 corresponding to the second light-transmissive apertures 320. In this embodiment, the projected area of each of the third light-transmissive apertures 310 is substantially equal to that of a corresponding second light-transmissive aperture 330, thereby further improving light transmissibility.

In the above embodiment, the material, structure and deposition method of the substrate 30, the first electrode layer 31, the photoconductive layer 33 and the second electrode layer 32 are the same as those in the first preferred embodiment.

A third preferred embodiment of the present invention is a method for manufacturing a translucent solar cell. The method comprises the steps of:

(1) sequentially stacking a substrate, a first electrode layer, a photoconductive layer and a second electrode layer;

(2) providing a mask and a laser beam;

(3) directing the laser beam through the mask to remove part of a material of the second electrode layer, thereby forming a plurality of first light-transmissive apertures; and (4) directing the laser beam through the mask and the first light-transmissive apertures to remove part of a material of the photoconductive layer, thereby forming a plurality of second light-transmissive apertures, wherein a projected area of each of the second light-transmissive apertures is smaller than that of a corresponding first light-transmissive aperture.

In addition, the above manufacturing method may further comprise a step of: directing the laser beam through the mask in a depth direction to the first electrode layer, thereby forming a plurality of third light-transmissive apertures. In this embodiment, the material, structure and deposition method of the substrate, the first electrode layer, the photoconductive layer and the second electrode layer are the same as those in the second preferred embodiment.

The present invention has been explained in relation to preferred embodiments thereof, which are presented for illustrative purposes only, and not intended to limit the scope of the present invention. Furthermore, the description of the present invention should be readily understood and can be practiced by those skilled in the art. Therefore, alterations and modifications can be made to the present invention without departing from the scope or spirit of the present invention. Such alterations and modifications should be construed as equivalent variations or designs made according to the spirit of the present invention and are encompassed by the appended Claims.

What is claimed is:

1. A translucent solar cell, consisting of, in order of stacking, a substrate, a first electrode layer, a photoconductive layer and a second electrode layer;

wherein the photoconductive layer is a single layer structure;

wherein a plurality of first light-transmissive apertures are formed on the second electrode layer, and the plurality of first light-transmissive apertures are further extended in a depth direction to the photoconductive layer to form a plurality of second light-transmissive apertures corresponding to the first light-transmissive apertures;

wherein a projected area of each of the second light-transmissive apertures is smaller than that of a corresponding first light-transmissive aperture such that short-circuits between the first electrode layer, the photoconductive layer and the second electrode layer are avoided;

wherein the second light-transmissive apertures are further extended in the depth direction to the first electrode layer so as to form a plurality of third light-transmissive apertures directly abutted against the substrate, wherein the projected area of the third light-transmissive apertures is equal to that of the second light-transmissive apertures;

wherein the first electrode layer and the second electrode layer comprise a transparent conductive oxide selected from the group consisting of $SnO_2$, ITO, ZnO, AZO, GZO, and IZO respectively.

2. The translucent solar cell as claimed in claim 1, wherein a projected shape of each of the first light-transmissive apertures is selected from the group consisting of a strip shape, a rectangular, a polygonal, a circular, an elliptical, and an arcuate shape.

3. The translucent solar cell as claimed in claim 1, wherein the plurality of first light-transmissive apertures are arranged in an array.

4. The translucent solar cell as claimed in claim 1, wherein the plurality of first light-transmissive apertures are arranged in a pattern that is corresponding to a pattern on a mask.

5. The translucent solar cell as claimed in claim 1, wherein the substrate is composed of a transparent material.

6. The translucent solar cell as claimed in claim 1, wherein the first electrode layer is formed on the substrate by a method selected from the group consisting of sputtering, atmospheric pressure chemical vapor deposition and low pressure chemical vapor deposition.

7. The translucent solar cell as claimed in claim 1, wherein the first electrode layer is a single-layer structure or a multilayer structure.

8. The translucent solar cell as claimed in claim 1, wherein the photoconductive layer is composed of a material selected from the group consisting of crystalline silicon semiconductor, amorphous silicon semiconductor, semiconductor compound, organic semiconductor and photo sensitized dye.

9. The translucent solar cell as claimed in claim 1, wherein the second electrode layer comprises a metal layer of a material selected from a group consisting of Ag, Al, Cr, Ti, Ni and Au.

10. The translucent solar cell as claimed in claim 1, wherein the second electrode layer is a single-layer structure or a multilayer structure.

11. The translucent solar cell as claimed in claim 1, wherein the second electrode layer is formed on the photoconductive layer by a method selected from the group consisting of sputtering and physical vapor deposition.

12. The translucent solar cell as claimed in claim 1, wherein the photoconductive layer is formed on the first electrode layer by deposition.

13. The translucent solar cell as claimed in claim 1, wherein the first light-transmissive apertures and the second light-transmissive apertures are formed by using at least one mask in cooperation with a laser beam for layer removal.

14. The translucent solar cell as claimed in claim 13, wherein the mask has a plurality of groups of patterns having a predetermined shape.

* * * * *